United States Patent
Hashimoto et al.

(10) Patent No.: US 6,180,423 B1
(45) Date of Patent: Jan. 30, 2001

(54) METHOD FOR WAFER POLISHING AND METHOD FOR POLISHING PAD DRESSING

(75) Inventors: Shin Hashimoto, Osaka; Yoshiharu Hidaka, Toyama, both of (JP)

(73) Assignee: Matsushita Electronics Corporation, Osaka (JP)

(*) Notice: Under 35 U.S.C. 154(b), the term of this patent shall be extended for 0 days.

(21) Appl. No.: 09/108,323

(22) Filed: Jul. 1, 1998

(30) Foreign Application Priority Data

Jul. 2, 1997 (JP) .................................................. 9-177053

(51) Int. Cl.[7] .................................................. B24B 1/00
(52) U.S. Cl. .................................. 438/14; 216/84; 216/88; 438/692; 438/693
(58) Field of Search ............................ 216/89, 92, 88, 216/91, 84; 438/14, 692, 693

(56) References Cited

U.S. PATENT DOCUMENTS

| | | | |
|---|---|---|---|
| 5,216,843 | * 6/1993 | Breivogel et al. | 51/131.1 |
| 5,643,051 | * 7/1997 | Zhou et al. | 451/11 |
| 5,989,107 | * 11/1999 | Shimizu et al. | 451/57 |

FOREIGN PATENT DOCUMENTS

| | | |
|---|---|---|
| 57-86747 | * 5/1982 | (JP) . |
| 58-40353 | 3/1983 | (JP) . |
| 8-309659 | 11/1996 | (JP) . |
| 8-339979 | 12/1996 | (JP) . |
| 9-225812 | 9/1997 | (JP) . |

OTHER PUBLICATIONS

F. Chou, et al., "A Comprehensive CMP Fluid Dynamics 3-D Simulation", Proc. of VMIC Conference, pp. 175–179, Jun. 10–12, 1997.

* cited by examiner

*Primary Examiner*—Randy Gulakowski
*Assistant Examiner*—Shamim Ahmed
(74) *Attorney, Agent, or Firm*—McDermott, Will & Emery

(57) ABSTRACT

It is arranged such that the least common multiple of two numbers m and n of which one is prime to the other, is made as large as possible where the number m is the rotational speed (rpm) of a platen with a polishing pad affixed thereto and the number n is the rotational speed (rpm) of a carrier with a wafer mounted thereon. As a result of such arrangement, it is not until the platen completes m revolutions that a point on the polishing pad that comes into contact with a fixed point on the wafer returns to the original contact point with the fixed point at the start of polishing, and the resulting trajectory is therefore spread uniformly over the polishing pad. Each point on the wafer is brought into contact with most surface regions of the polishing pad, therefore preventing the wafer from undergoing deterioration in planarity uniformity due to a particular point on the wafer, on one hand, frequently coming into contact with low polishing-rate regions in the polishing pad and due to the other points on the wafer, on the other hand, less frequently coming into contact with the regions.

6 Claims, 13 Drawing Sheets

METHOD FOR WAFER POLISHING AND METHOD FOR POLISHING PAD DRESSING

BACKGROUND OF THE INVENTION

This invention relates to a method for polishing a surface of a wafer by CMP (chemical-mechanical polishing) and to a method for dressing a polishing pad which is used in such CMP.

Chemical-mechanical polishing (CMP), a combination of chemical and mechanical polishing, is an attractive polishing process for planarizing wafers incorporating therein semiconductor integrated circuits, to such an extent that the wafers are provided with almost perfect surface flatness. In a typical CMP technique, a wafer to be polished is mounted onto a polishing pad attached to a platen. The wafer is then rotated, during which a slurry-like abrasive liquid (dispersion of a colloidal silica in a liquid) is supplied between the wafer and the polishing pad, to polish a surface of the wafer.

SOG (spin-on-glass) and etch back are known in the art as a process for planarizing an upper surface of a film such as an interlayer dielectric film of a wafer. In the former process a wafer is spin-coated with a glass solution prepared by dissolution of glass in an organic solvent. In the latter process a film of photo resist is deposited on an interlayer dielectric film and these films are thereafter subjected to simultaneous etch back processing. The CMP process has the advantage over these two processes in that wafers can be planarized more perfectly because the CMP process combines both chemical polishing and mechanical polishing. However, the current technology of the CMP process is not satisfactory. Achieving ideal planarity everywhere in a wafer is still difficult and there is yet room for improvement in the CMP process. Various approaches have been made with a view to improving the uniformity of in-wafer planarity.

One of the approaches is set forth in Japanese Patent Publication (KOKAI) No. 8-339979. This application describes a technique for supporting a wafer lower surface with the aid of fluid, to improve the in-wafer planarity uniformity.

Another approach is described in Japanese Patent Publication (KOKAI) No. 9-225812. This application provides means for maintaining the degree of planarity at an adequate level while performing a CMP process, to improve the in-wafer planarity uniformity.

The following Preston equation is known and is generally used to calculate the CMP polishing rate (Rpo).

$$Rpo = k*P*V,$$

where k is the Preston coefficient, P is the pressure, and V is the polishing pad/wafer relative speed.

In order to improve in-plane uniformity of the polishing rate, based on the Preston equation, equalization in time quadrature of V (the polishing pad/wafer relative speed) at any points on the wafer is desired. In other words, it has been determined from the Preston equation that such equalization is achieved at an arbitrary point on the wafer to provide best in-plane polishing rate uniformity if both a polishing pad and a wafer rotate at the same speed.

However, CMP is a combination of chemical polishing and mechanical polishing, which makes, in actual process, variations in polishing state complicated. It is difficult to constantly place a polishing pad in an ideal state during a period of polishing. As described in a paper reported in VLSI Multilevel Interconnection Conference (1997), pp. 175–179, not every condition derived from the Preston equation yields best in-plane polishing rate uniformity. Although some reasons why the best conditions sometimes happen to differ from the Preston equation-based conditions may be pointed out, no novel guidelines for improving in-plane polishing rate uniformity are proposed in the foregoing paper.

For example, when mounting a polishing pad of closed-cell-foam type polyurethane onto a platen, the inventors of the present invention believe that the polishing rate varies for the following mechanical reason.

The closed-cell-foam type polyurethane polishing pad, as illustrated in FIG. 10, has at its surface a great number of recess portions with a diameter in a range of 50–100 $\mu$m. The recess portions result from the breaking of closed cells at the surface, and a slurry-like abrasive is held in the recess portions. During polishing, the abrasive is supplied between a polishing pad and a wafer little by little. If polishing debris, formed as a result of polishing of the wafer and the pad, is collected in a recess portion, or if recess-portion blocking occurs locally owing to the load of the wafer, polishing is not performed on a portion of the wafer corresponding to such a recess portion filled with polishing debris. Because of the foregoing, the polishing pad will undergo a local variation in polishing rate, resulting in a drop in overall polishing rate. To cope with this problem, the surface of the polishing pad is grounded with a dressing disk having abrasive particles such as diamond after the polishing pad has been used for a certain length of time. This allows the entire polishing pad to become re-activated, and there are formed new recess portions at the surface. However, to date, it is difficult to completely prevent clogged recess portions and deterioration in planarity between one dressing and the next dressing.

The inventors of the present invention noted that the following points suggest that the foregoing in-pad local polishing rate variation adversely affects uniformity of the wafer planarity.

Specifically, after a polishing pad is subjected to a dressing process, it sometimes occurs that grains of diamond, dettached from a dressing disk and then remaining on a polishing pad, produce in the wafer a deep, large scratch visible to even the naked eye. This scratch was observed and the observation result shows that the size of the scratch is large and deep as compared with those of the diamond grain. The reason why such a large scratch is created may be explained as follows. A grain of diamond, cut into a wafer, passes through a fixed trajectory many times with pad/wafer relative rotational motion, as a result of which the original micro scratch gradually develops until visible to the naked eye.

To summarize, in the case there exists the foregoing non-uniformity of polishing rate in a polishing pad, if there is locally created a low polishing-rate portion in the polishing pad which frequently passes through a corresponding wafer region (in other words if a fixed point on the wafer frequently passes through a specific region on the polishing pad) the variation in polishing rate of the polishing pad gradually promotes deterioration in wafer planarity uniformity. However, the relationship between polishing pad rotation and wafer rotation has been little considered in conventional CMP processing.

SUMMARY OF THE INVENTION

Based on the appreciation of the foregoing problems, the present invention was made. Apart from the problem of polishing-pad planarity and the problem of accuracy (e.g., parallelism between wafer and polishing pad), a major object of the invention is therefore to provide a method capable of improving uniformity in the wafer planarity by achieving uniform distribution of regions of a polishing pad that come into contact with each point of the wafer without ill effect (i.e., non-uniformity in the polishing rate in the polishing pad).

The present invention provides a wafer polishing method comprising the steps of:
(a) rotating a polishing pad affixed to a platen at a first rotational speed;
(b) supplying an abrasive material over a surface of said polishing pad; and
(c) pressing a wafer to be polished against said polishing pad surface while at the same time rotating said wafer at a second rotational speed;
wherein the ratio of said first rotational speed to said second rotational speed is controlled such that a trajectory, formed by points on said polishing pad that come, in turn, into contact with a fixed point on said wafer, is distributed uniformly on said polishing pad.

One important aspect of the method of the present invention is that, during polishing, an arbitrary point on the wafer is brought into contact with as many points on the polishing pad as possible. Such a method eliminates a harmful influence due to a variation in local polishing rate occurring in the polishing pad, therefore improving the post-polishing uniformity of planarity of a wafer surface to be polished.

A variation to the foregoing method can be made in which said rotational speed ratio is controlled such that said points on said polishing pad do not form a substantially fixed trajectory during polishing.

One important aspect of the foregoing variation is that every point on the wafer is brought into contact with many regions on the polishing pad. Such arrangement eliminates a harmful influence due to a variation in local polishing rate occurring in the polishing pad, therefore improving the post-polishing uniformity of planarity of a wafer surface to be polished.

Another variation to the foregoing method can be made in which said rotational speed ratio is controlled such that, when said ratio is expressed using two natural numbers m and n of which one is prime to the other, the least common multiple of said numbers m and n is ten or beyond.

One important aspect of the foregoing variation is as follows. When the platen makes m revolutions, the wafer makes mn/m (=n) revolutions, and a point on the polishing pad that comes into contact with the fixed point on the wafer returns to its home position and then moves over a fixed trajectory. When the least common multiple of the numbers m and n is large, however, the overall length of the fixed trajectory extends. Corresponding to such an extension, the fixed trajectory passes through a greater number of regions on the polishing pad. This avoids a situation of an arbitrary point on the wafer coming into contact with a low polishing-rate region, that is locally created in the polishing pad, with considerable frequency as compared with other points on the wafer. This improves the post-polishing uniformity of planarity of a wafer surface to be polished.

Yet another variation to the foregoing method can be made in which said rotational speed ratio is controlled to be an approximate irrational number.

On important aspect of the foregoing variation is that, even when the ratio of the platen rotational speed to the wafer rotational speed is approximately expressed by a ratio represented by integers, the least common multiple of these integers is considerably large. Accordingly, until the time when points on the polishing pad that come into contact with a certain point on the wafer enter a fixed trajectory, the fixed trajectory have passed through every region on the polishing pad. Additionally within a given polishing time that is practically limited, points on the polishing pad that come into contact with one point on the wafer will not get into a fixed trajectory. Accordingly, the foregoing operation and effects of the present invention can be significantly obtained.

Another variation to the foregoing method can be made in which said polishing pad is formed of a closed-cell-foam type polyurethane resin.

One important aspect of the foregoing variation is as follows. Even when a low polishing-rate portion is locally created because a recess portion, which is formed by breaking of a closed cell, becomes blocked with polishing debris or is broken, a case, in which influence by the presence of such a low polishing-rate portion is strongly exerted on only a specific point on the wafer, does not occur by virtue of the foregoing operation. This ensures that the foregoing operation and effects of the present invention can be obtained.

In another variation to the foregoing method, said polishing pad is provided with periodically-formed grooves or pores.

One important aspect of the foregoing variation is that smooth supply and discharge of a slurry-like abrasive material are carried out through grooves or pores. Although a clogged groove or pore can be taken as an inactive region that does not substantially contribute to the action of polishing, a case, in which influence by the presence of such a clogged groove is strongly exerted on only a specific region, does not occur by virtue of the foregoing operation. This ensures that the foregoing operation and effects of the present invention can be obtained.

The present invention also discloses a polishing-pad dressing method comprising the steps of:
(a) rotating a polishing pad affixed to a rotary platen, at a first rotational speed; and
(b) pressing a dresser against a surface of said polishing pad while at the same time rotating said dresser at a second rotational speed for activation of said polishing pad surface;
wherein the ratio of said first rotational speed to said second rotational speed is controlled such that a trajectory, formed by points on said polishing pad that come into contact with a fixed point on said dresser, is distributed uniformly on said polishing pad.

A variation to the foregoing method can be made in which said rotational speed ratio is controlled such that said points on said polishing pad do not form a substantially fixed trajectory during polishing.

Another variation to the foregoing method can be made in which said rotational speed ratio is controlled such that, when said ratio is expressed using two natural numbers m and n of which one is prime to the other, the least common multiple of said numbers m and n is ten or beyond.

Yet another variation to the foregoing method can be made in which said rotational speed ratio is controlled to be an approximate irrational number.

Important aspects of the foregoing variations to the aforesaid method are as follows. A case is considered in which a polishing pad is subjected to dressing with the aid of a dresser with very fine diamond grains embedded therein. If diamond grains that differ from one another in shape and in dimensions draw the same trajectories respectively on the polishing pad, this results in deterioration in dressing uniformity. However, such deterioration can be suppressed by the present invention, resulting in providing almost uniform polishing pad activation.

DETAILED DESCRIPTION OF THE INVENTION

Preferred embodiments of the present invention are now described below.

Embodiment 1

Figure 1:
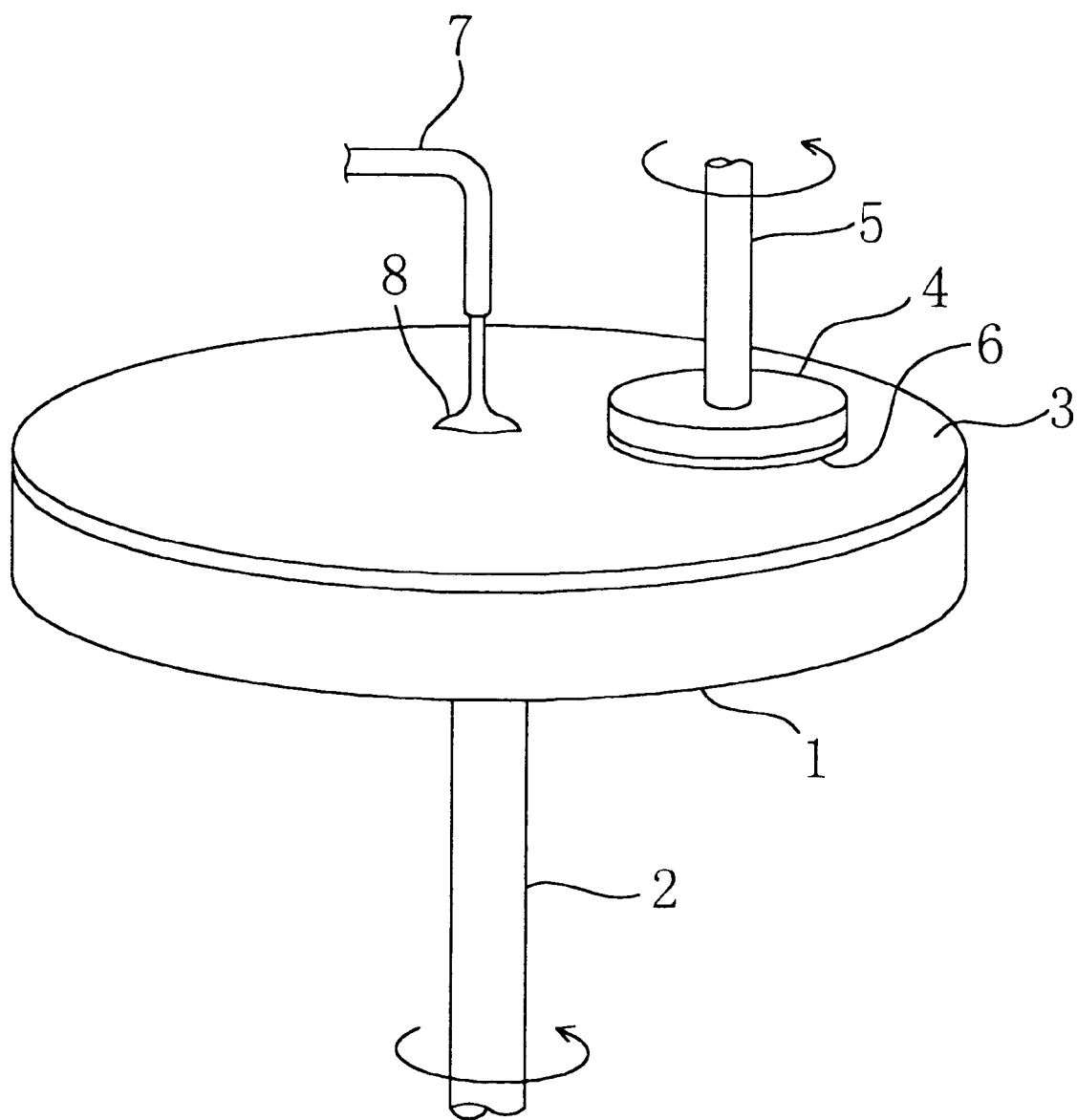
FIG. 1 is a perspective view outlining a way of polishing a wafer by a CMP polishing apparatus of a first embodiment of the invention.

FIG. 1 is a perspective view of an exemplary structure of a polishing apparatus used in a CMP process in accordance with a first embodiment of this invention. A CMP polishing apparatus of the present embodiment, manufactured by Speedfam Company Limited, includes a disk-like platen 1 rotatable about its central axis, a platen shaft 2 which centrally supports the platen 1, a polishing pad 3 affixed onto the platen 1 and formed of a closed-cell-foam type polyurethane resin and an unwoven cloth, a disk-like carrier 4 on which is mounted a silicon wafer 6, a carrier shaft 5 which centrally supports the carrier 4, and a polishing liquid supply apparatus 7 for supplying a slurry-like polishing liquid 8 the main component of which is colloidal silica. Both the platen shaft 2 and the carrier shaft 5 are forcefully rotated by servomotor or the like. The rotational speed of the platen shaft 2 and the rotational speed of the carrier shaft 5 are variably controlled independently of each other.

Figure 2:
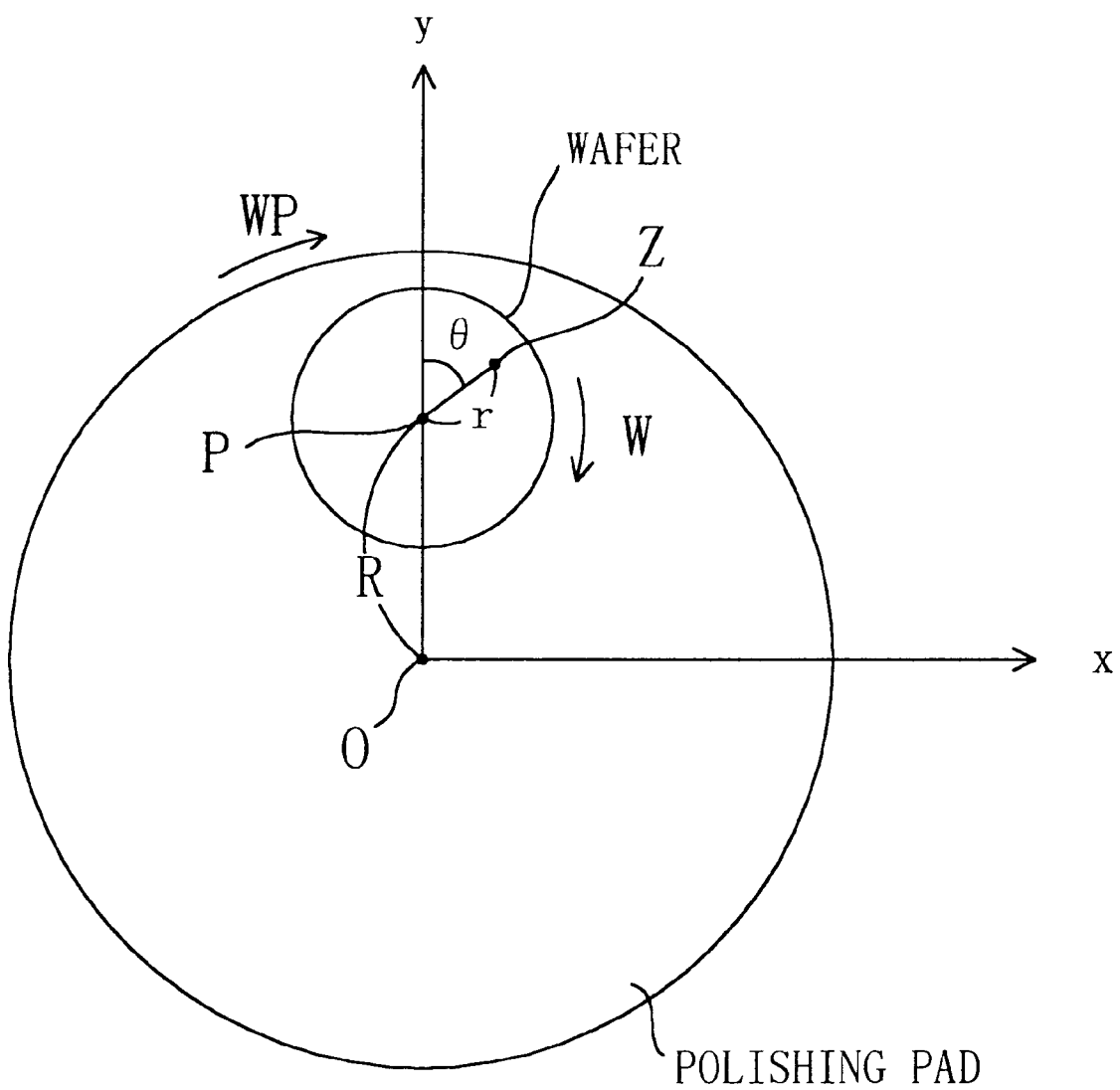
FIG. 2 is a complex plane representation useful for understanding relative motion between a polishing pad and a wafer in the first embodiment.

FIG. 2 is a complex plane representation showing a positional relationship between the polishing pad 3 and the wafer 6 in the CMP polishing apparatus of the present invention. Making reference to FIG. 2, the manner of relative motion resulting from the rotation of the polishing pad 3 (i.e., the rotation of the platen 1) and the rotation of the wafer 6 (i.e., the rotation of the carrier 4), is illustrated.

Parameters of FIG. 2 concerning both the rotational motion of the carrier 2 and the rotational motion of the platen 1 are as follows.

r: distance between wafer center P (i.e., the wafer rotational center) and point Z on the wafer R: distance between P and polishing pad center O (i.e., the polishing pad rotational center)

w: wafer rotational angular speed

θ: wafer initial phase angle wp: platen rotational angular speed

The carrier 4 can hold thereon a plurality of wafers in some cases. However, for convenience the present embodiment is illustrated in terms of a case in which only one wafer 6 is mounted on the carrier 4. Additionally, the center of the wafer 6 coincides with that of the carrier 4 and the centre of the polishing pad 3 coincides with that of the platen 1.

Defining a state, in which the wafer center P and the polishing pad center O are offset in y (imaginary) axis direction in a complex plane, as an initial state, and if the initial phase angle θ of the point Z on the wafer and the polishing time t in a rest frame are variables, the position of the point Z in rotational motion in clockwise (CCW) direction is given by the following equation (1). In the equation (1), i represents the imaginary unit.

$$Z(t, \theta)=iR+r \operatorname{Exp}\{i(-wt+\theta)\} \quad (1)$$

If such wafer motion is observed on the polishing pad which rotates in CCW direction, this determines a trajectory formed or drawn by the point Z on the polishing pad. What is required to find the trajectory is to find a CCW rotational mapping of Equation (1), which is given by the following equation (2).

$$Z \to Zp(t, \theta)=\operatorname{Exp}(iwpt)[iR+r \operatorname{Exp}\{i(-wt+\theta)\}]=iR \operatorname{Exp}(iwpt)+r \operatorname{Exp}[i\{(wp-w)t+\theta\}] \quad (2)$$

How the trajectory varies is determined by the ratio of w to wp on the basis of Equation (2). For example, when wp is twice w, the following equation (4) is derived from substitution of Equation (3) in Equation (2).

$$wp=2w \quad (3)$$

$$Zp=iR \operatorname{Exp}(i2wt)+r \operatorname{Exp}\{i(wt+\theta)\} \quad (4)$$

If the location of a point X on the wafer which is advanced in initial phase angle by pi (180°) with respect to the initial phase angle θ of the point Z is obtained from Equation (4), the result is given by the following equation (5).

$$Zp(t, \theta+pi)=iR \operatorname{Exp}(i2wt)+r \operatorname{Exp}[\{i(wt+\theta+pi)\}] \quad (5)$$

Further, if the location of the point X after a lapse of a time pi/w is obtained from Equation (4), this results in the following equation (6). Equations (4) and (6) completely agree with each other.

$$Zp(t+pi/w, \theta+pi)=iR \operatorname{Exp}\{i(2 \ wt+2pi)+r \operatorname{Exp}[i\{w(t+pi/w)+\theta+pi)\}]= iR \operatorname{Exp}(i2 \ wt)+r \operatorname{Exp}[\{i(wt+\theta+pi)\}]=Zp(t, \theta) \quad (6)$$

In other words, if w/wp=½, a trajectory drawn on the pad by contact between the point Z and the pad completely agrees with another drawn on the pad by a contact point between the point X and the pad (these two points Z and X are in symmetry with respect to P, in other words they differ from each other in phase by 180°), with only a time lag of w/pi (½ of the period of w).

A commonly-used condition of w/wp=½ (for example, w=30 rpm and w=60 rpm) means that both an arbitrary point on the wafer and another point opposite thereto with respect to the wafer center keep rotating along the same trajectory thirty times per minute.

If a polishing pad, on which two different points on a wafer move along the same trajectory, has a local factor that contributes to a variation in polishing rate, such a micro factor (i.e., the local factor) will gradually develop on the surface of the wafer thereby finally producing an unwanted macro phenomenon that deteriorates planarity uniformity of the wafer. For instance, if a notch present on one point causes a polishing pad surface to undergo a non-uniform variation thereby resulting in an abnormal polishing rate, this has an effect on the opposite side to the one point; for example, the polishing pad is compressed excessively.

Generally, in a case in which the polishing pad angular speed wp is 2n times as large as the wafer angular speed w where the number n is any integer, points of the wafer (the phase difference in wafer rotation therebetween being pi/n) move along the same trajectory over the polishing pad.

For example, if wp:w=4:1, four points of the wafer, i.e., an arbitrary point, a second point (rotated 90° from the arbitrary point around the wafer center), a third point (rotated 180°), and a fourth point (rotated 270°), move along the same trajectory. Such a situation must be avoided in CMP recipe preparation. However, the relationship between platen rotational speed and carrier rotational speed has been little considered until the present invention.

Figure 3:
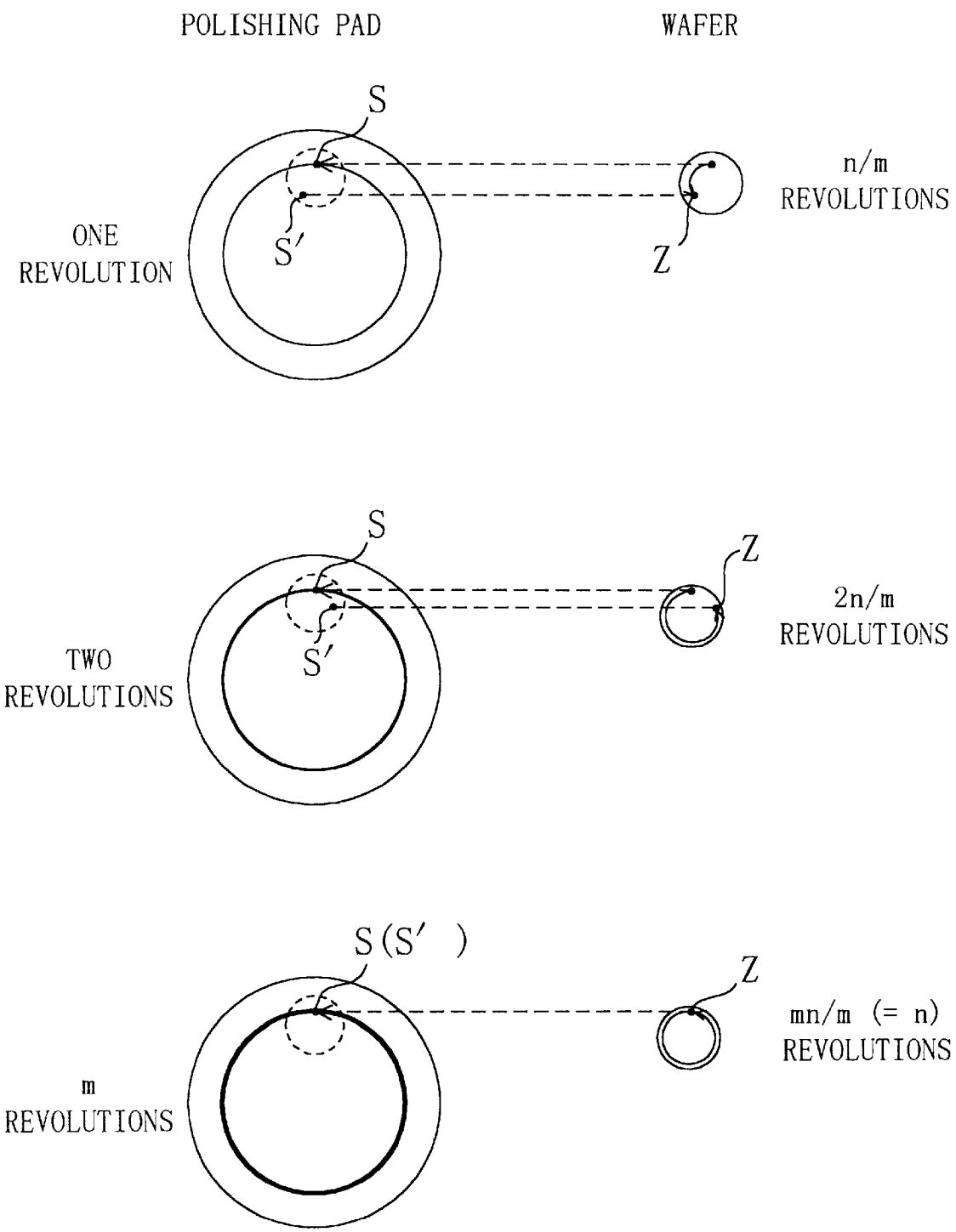
FIG. 3 is a top view showing respective contact positions at which a fixed point on the wafer contacts with the polishing pad when the polishing pad makes revolutions an integral number of times, namely one revolution, two revolutions, and m revolutions in the first embodiment.

Inconveniences occur, even when the platen-carrier rotational speed ratio is simply expressed by integers, let alone when the ratio is expressed in a simple ratio form such as (integer):1. An exemplary case is now considered in which the ratio of the polishing pad angular speed and the wafer angular speed is m:n where the number m is prime to the number n and the numbers m and n are positive integers other than 1. FIG. 3 is a diagram showing rotational states of the polishing pad and rotational states of the wafer when the polishing pad makes one revolution, when the polishing pad makes two revolutions, and when the polishing pad makes m revolutions respectively. Suppose here that Point Z on the wafer is in contact with Point S on the polishing pad in the initial state (see FIG. 3). Point S is a start point at which a fixed trajectory starts. When the platen makes one revolution from the initial state, the carrier makes n/m revolutions. Since the number m is prime to the number n, division of n by m, i.e., n/m, never produces an integral result, and Point S' on the polishing pad that comes into contact with Point Z on the wafer will never conform to Point S. When the platen makes m revolutions, the carrier makes mn/m (=n) revolutions, and Point S' on the polishing pad that comes into contact with Point Z on the wafer conforms to Point S (i.e., the original contact point) for the first time, in other words a point on the polishing pad that comes into contact with Point Z on the wafer arrives at Point S where the fixed trajectory starts. The polishing pad and the wafer thereafter repeat the same relative motion, as a result of which Point Z on the wafer moves along the fixed trajectory on the polishing pad.

When the least common multiple (L.C.M.) of the integers m and n (the number m is prime to the number n), i.e., mn, is large, the length of the fixed trajectory extends. In addition to making contact with a specific point on the polishing pad, Point Z on the wafer is evenly brought into contact also with many other points on the polishing pad. On the other hand, when the L.C.M. is small, Point Z soon returns to Start Point S and thereafter moves along the same trajectory, in other words Point Z comes into contact with limited regions. This produces the possibility that a specific point on the wafer is frequently brought into contact with a low polishing-rate region that is locally created in the polishing pad while other points on the wafer infrequently come into contact with the region.

The following conclusions are drawn from the above consideration.

1. When the platen-carrier rotational speed ratio is expressed by two natural numbers, i.e., n and m (the number n is prime to the number m), it is preferable to make the L.C.M. of these numbers m and n, i.e., mn, as large as possible. The experiments, which are described later, show that the L.C.M. of the numbers m and n (mn) is preferably 10 or beyond.

2. It is particularly preferred that the platen-carrier rotational speed ratio, i.e., the platen-carrier angular speed ratio, nearly corresponds to, or is approximated to an irrational number that cannot be expressed in the form of a natural (rational) number m/n. Practically it is difficult to allow the ratio to exactly correspond to an irrational number; however, if the ratio is an approximate irrational number this makes it possible for Point Z on the wafer to come into contact with almost every point on the polishing pad without travelling on the fixed trajectory on the polishing pad in a limited polishing period of time. Setting of such a rotational speed ratio which is an approximate irrational number can be achieved easily by setting rotational speeds for motors that drive the carrier shaft 5 and the platen shaft 2.

3. Taking into account a practically limited period of time taken for polishing, it is sufficient that the platen-carrier rotational speed ratio is set in such a way as to prevent entrance of a point on the polishing pad to a fixed trajectory during polishing. In other words the rotational speed ratio is set in order for a point on the polishing pad that comes into contact with Point Z on the wafer not to conform to Start Point S, with the polishing pad and the wafer rotated an integral number of times.

4. Taking into account the state of the foregoing trajectory, it is preferred that, although the surface region of the polishing pad is divided into sub-regions by a trajectory drawn by a point on the polishing pad that comes into contact with Point Z on the wafer (see FIG. 5), these sub-regions are uniform in size and fine within concentric ring-like regions, i.e., within ring-like regions having identical radii from the polishing pad center ○. In other words, it is preferred that the foregoing trajectory is evenly distributed on the polishing pad, to densely form lattice-like patterns thereon.

Substantially, the number of revolutions of a CMP polishing apparatus is m (rpm) where m is an integer. Points on the polishing pad that come into contact with Point Z on the wafer repeatedly form the same trajectory at polishing time intervals of about one minute. The process of polishing is carried out for about four minutes at most, and it is therefore preferred that the same fixed trajectory is not drawn four times or more during polishing.

In the above-described analyses the carrier (wafer) is subjected to rotational motion only. The carrier may be subjected, in addition to rotational movement, to reciprocating motion (translational motion) either in a direction perpendicular to the direction in which the platen rotates, in a direction corresponding to the direction in which the platen rotates, or in a direction diagonally intersecting with the direction in which the platen rotates. Additionally, by sufficiently expanding the range of such translational motion to replace the number of times per unit time reciprocate motion is carried out with the number of revolutions per unit time of the carrier, the same effects as the above can be achieved without having to rotate the carrier depending on the case.

In the present embodiment, the number of wafers mounted on the carrier is one. The present invention is also applicable to cases in which a plurality of wafers are mounted on a single carrier. In such a case each wafer point rotates on the carrier center and the analyses of the foregoing equations (1) to (6) can be utilized, by taking (i) r=the distance from the carrier center to Point Z of the wafer and (ii) R (offset distance)=the distance from the polishing pad center O to the carrier center.

Experimental examples and comparative examples (conventional conditions) for analyzing trajectories on polishing pads (platens) are now described below. A polishing apparatus by Speedfam Company Limited was used. In each example, the initial phase angle θ is 45 degrees, the wafer diameter r is 100 mm, the offset distance R is 162.5 mm, and the polishing time is 60 seconds. A target for polishing is a p-type TEOS film or a p-type BPSG film formed on a wafer.

EXPERIMENTAL EXAMPLE 1

Figure 4:
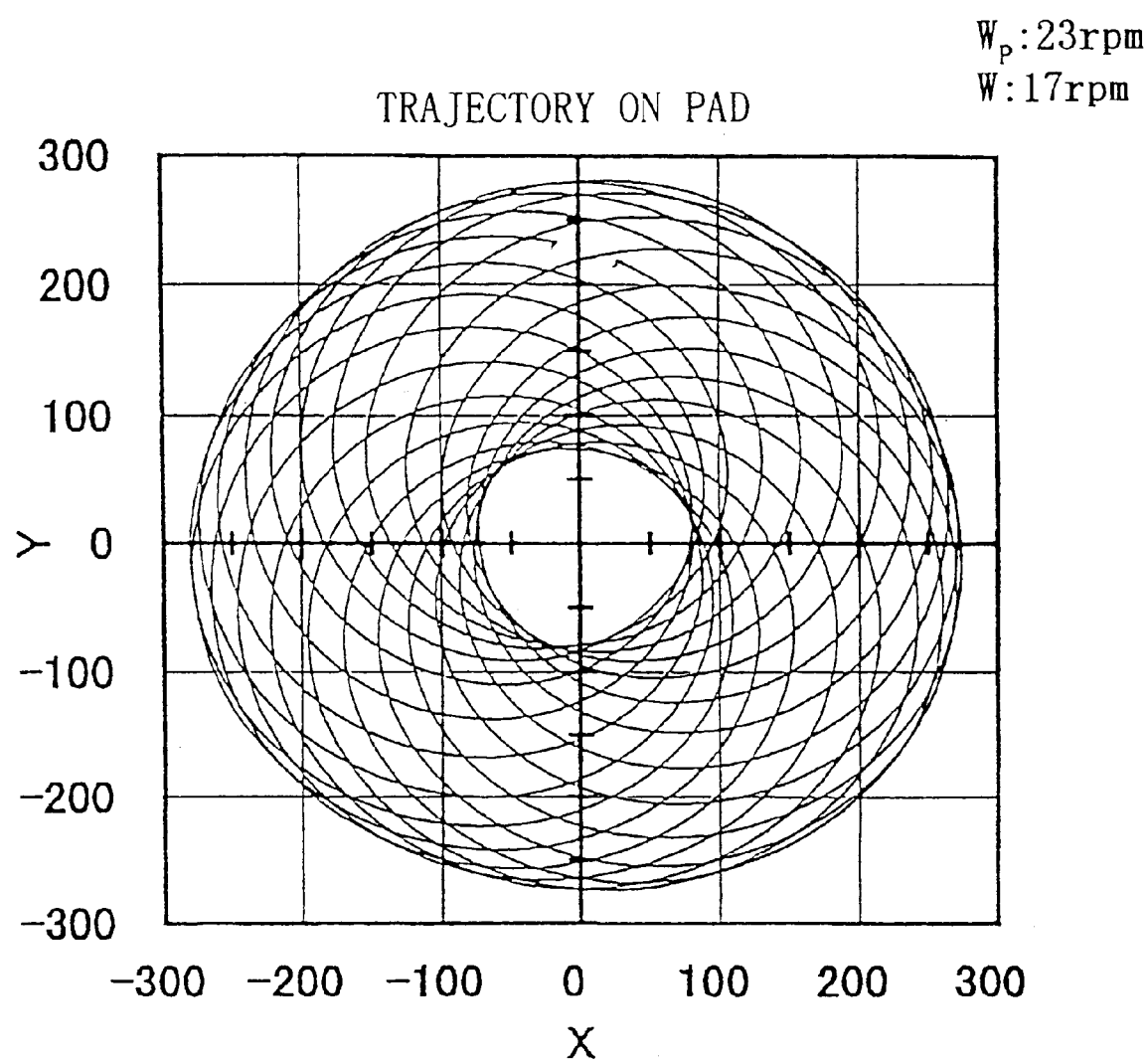
FIG. 4 is a top view of a trajectory drawn on the polishing pad in Experimental Example 1.

FIG. 4 illustrates a trajectory drawn on a polishing pad by a single point (a fixed point) on a wafer in Experimental Example 1 in accordance with the present invention. Polishing conditions of the present experimental example are CMP conditions for planarization of BPSG films and the platen rotational speed (wp) is 23 rpm. The carrier rotational speed (w) is 17 rpm. In other words, the platen-carrier rotational speed ratio is expressed by two numbers, 23 and 17, of which one number is prime to the other number, and the L.C.M of these two numbers, i.e., 23×17 (=391), is large. As can be seen from the figure, within a time less than the polishing time (60 seconds) there is drawn no fixed trajectory on the polishing pad and a certain point on the wafer does not move along a fixed trajectory on the polishing pad. When polishing is carried out for 60 seconds, i.e., when the platen makes 23 revolutions, the fixed point on the wafer returns to the original contact point on the polishing pad, in other words a point on the polishing pad that comes into contact with the fixed point on the wafer does not enter the fixed trajectory. Even in such a case the fixed point on the wafer equally comes into contact with many regions on the polishing pad, therefore avoiding ill effects due to a local variation in polishing rate.

EXPERIMENTAL EXAMPLE 2

Figure 5:
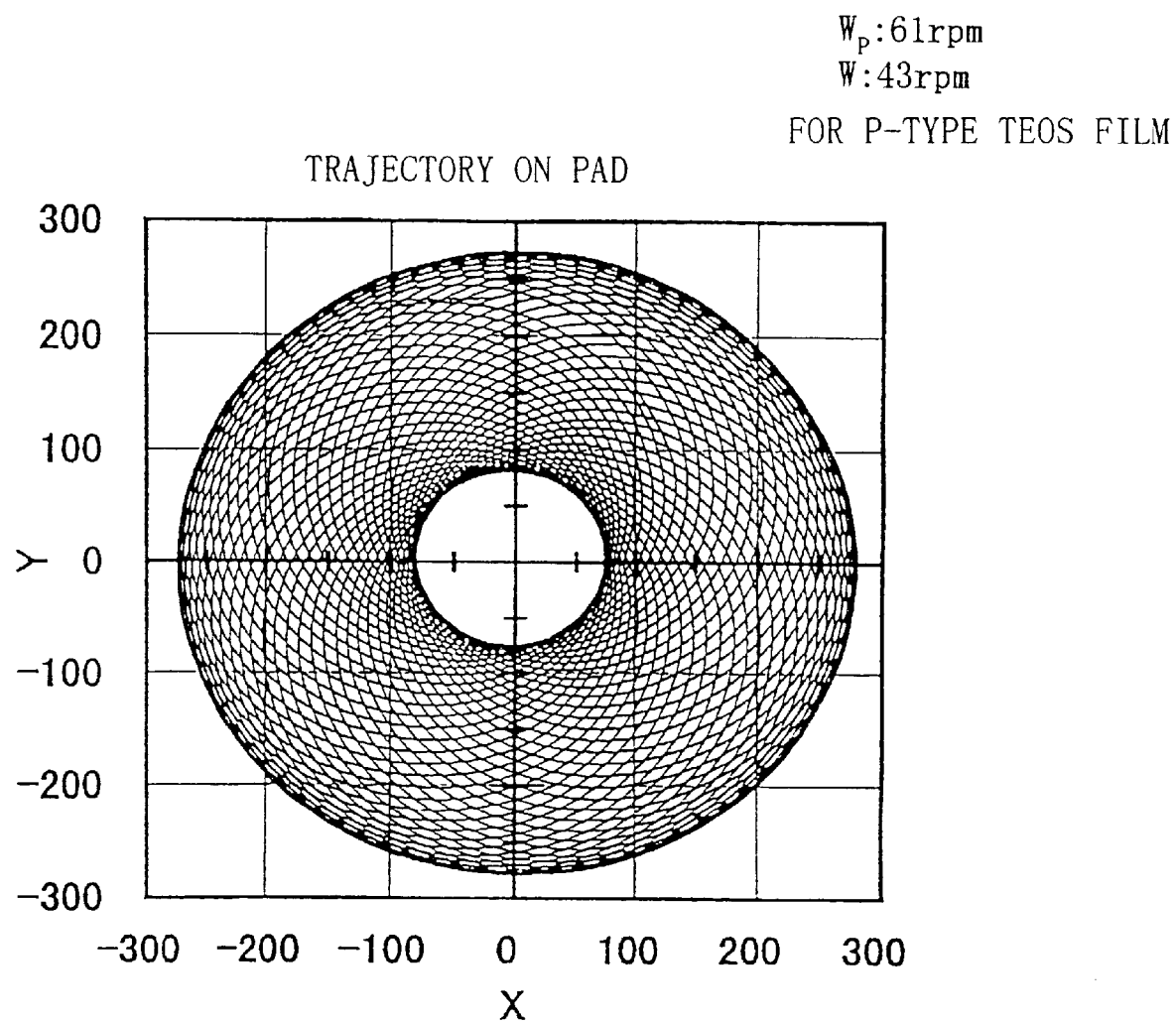
FIG. 5 is a top view of a trajectory drawn on the polishing pad in Experimental Example 2.

FIG. 5 is a diagram showing a trajectory drawn on a polishing pad by a fixed point on a wafer in Experimental Example 2 in accordance with the present invention. Polishing conditions of the present experimental example are CMP conditions for planarization of p-type TEOS films. The platen rotational speed (wp) is 61 rpm and the carrier rotational speed (w) is 43 rpm. In other words, the platen-carrier rotational speed ratio is expressed by two numbers, 61 and 43, of which one number is prime to the other number, and the L.C.M of these two numbers, i.e., 61×43 (=2643), is large. As can be seen from the figure, within a time less than the polishing time (60 seconds), a point on the polishing pad that comes into contact with the fixed point on the wafer does not enter a fixed trajectory. When polishing is carried out for 60 seconds, i.e., when the platen makes 61 revolutions, a certain point on the wafer returns to the original contact point on the polishing pad. Even in such a case, the point on the wafer equally comes into contact with many regions on the polishing pad, therefore avoiding ill effects due to a local variation in polishing rate.

Comparative Example 1

Figure 6:
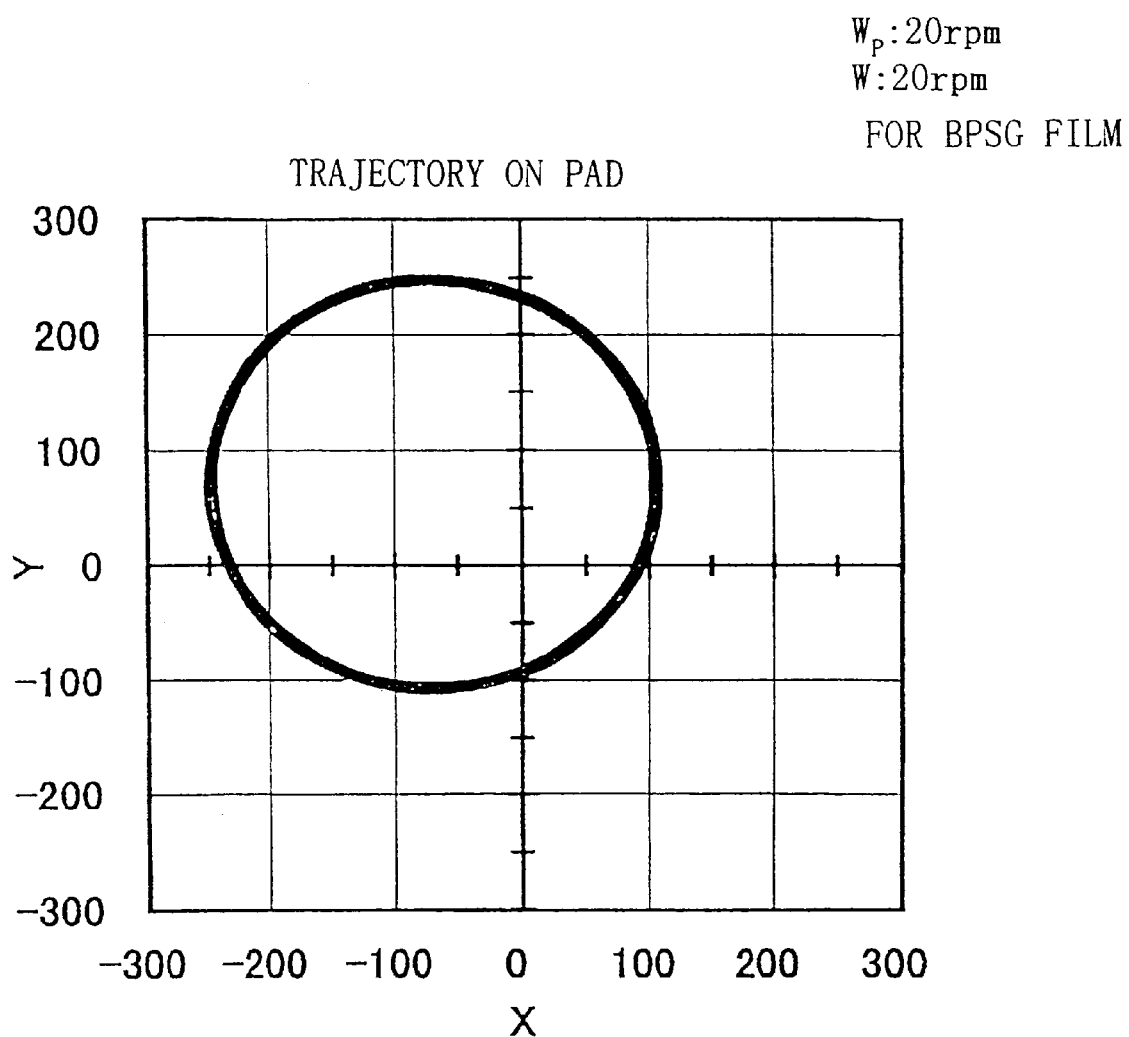
FIG. 6 is a top view of a trajectory drawn on the polishing pad in Comparative Example 1.

FIG. 6 is a diagram of a trajectory drawn on a polishing pad by a point on a wafer in Comparative Example 1. Polishing conditions of Comparative Example 1 are conventional CMP conditions used for planarization of BPSG films. The platen rotational speed wp is 20 rpm and the carrier rotational speed w is 20 rpm. As can bee seen from FIG. 6, resonance occurs so that a fixed trajectory, which is in an almost perfect circular form, is drawn on the polishing pad. This shows that a certain point on the wafer frequently comes into contact with limited regions on the polishing pad.

Comparative Example 2

Figure 7:
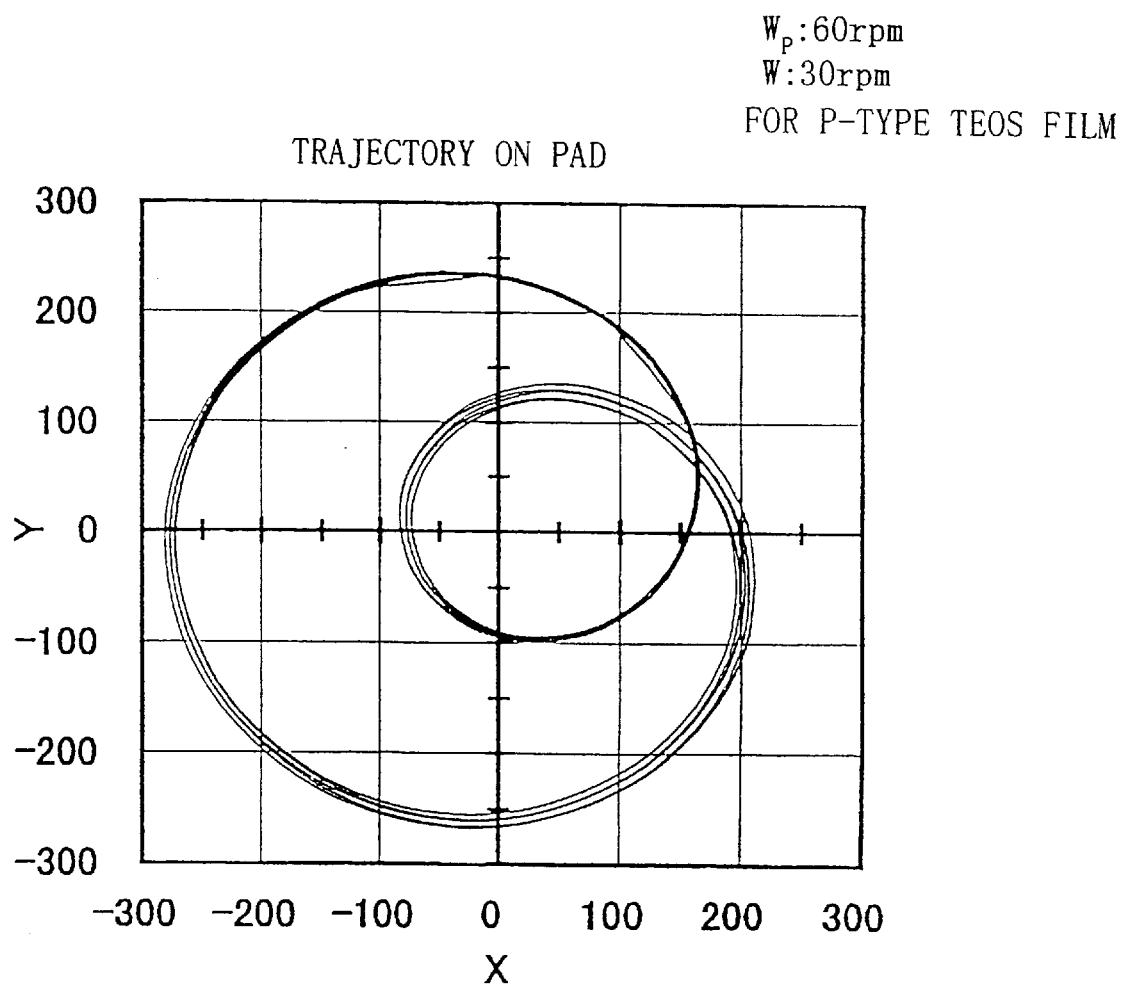
FIG. 7 is a top view of a trajectory drawn on the polishing pad in Comparative Example 2.

FIG. 7 is a diagram of a trajectory drawn on a polishing pad by a point on a wafer in Comparative Example 2. Polishing conditions of Comparative Example 2 are conventional CMP conditions used for planarization of p-type TEOS films. The platen rotational speed wp is 60 rpm and the carrier rotational speed w is 30 rpm. In other words, the platen-carrier rotational speed ratio is expressed by two numbers, 2 and 1, of which one number is prime to the other number, and the L.C.M of these two numbers, i.e., 2×1 (=2), is small. As shown in the figure, a point on the polishing pad that comes into contact with a fixed point on the wafer returns to the start point of a fixed trajectory every time the platen makes two revolutions and thereafter resonance occurs resulting in motion along the fixed trajectory. This shows that a certain point on the wafer frequently (but less frequently than in Comparative Example 1) comes into contact with only limited regions on the polishing pad.

Comparative Example 3

Figure 8:
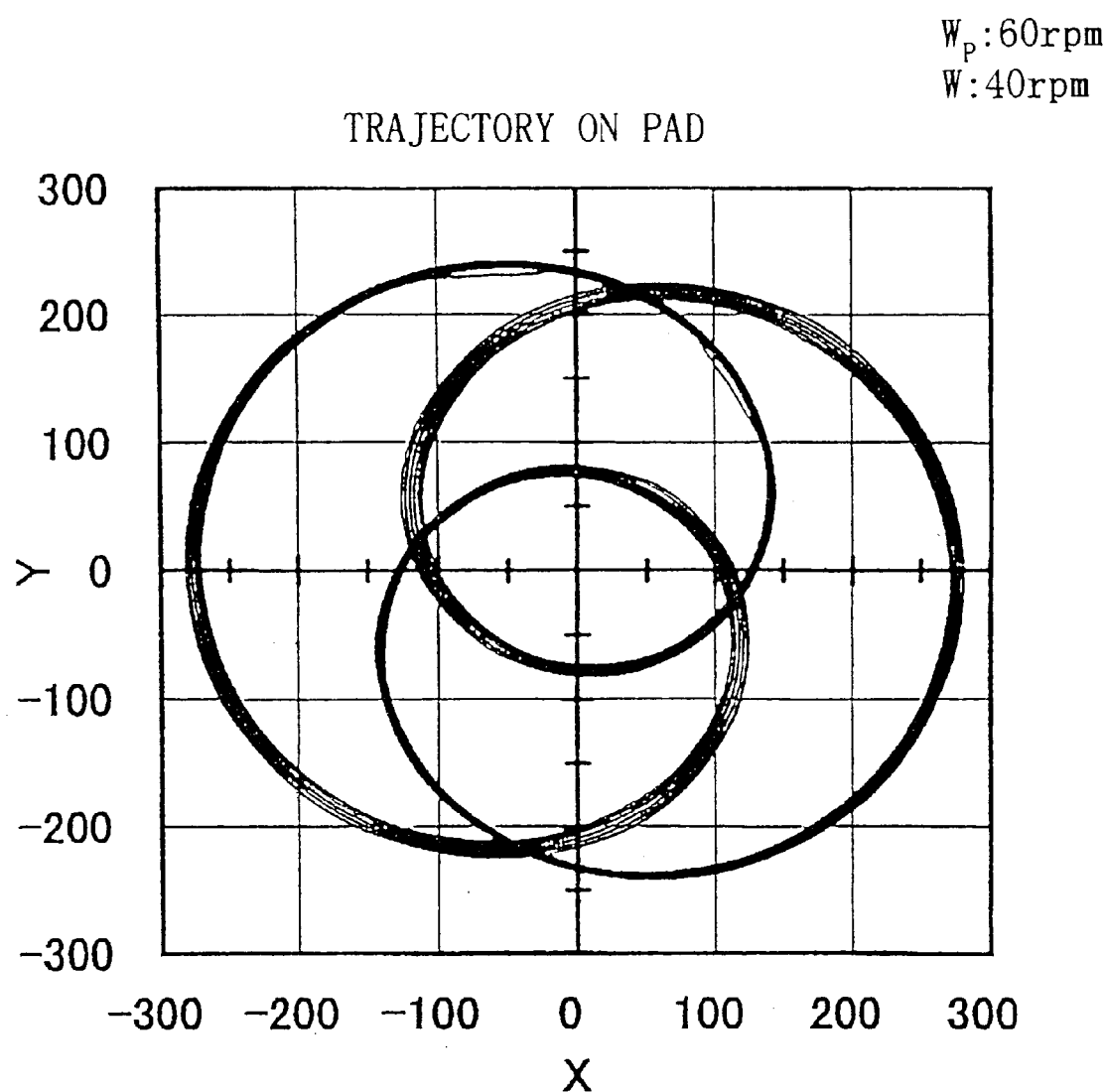
FIG. 8 is a top view of a trajectory drawn on the polishing pad in Comparative Example 3.

FIG. 8 is a diagram of a trajectory drawn on a polishing pad by a fixed point on a wafer in Comparative Example 3. Polishing conditions of Comparative Example 3 are conventional CMP conditions. The platen rotational speed wp is 60 rpm and the carrier rotational speed w is 40 rpm. In other words, the platen-carrier rotational speed ratio is expressed by two numbers, 3 and 2, of which one number is prime to the other number, and the L.C.M of these two numbers, i.e., 3×2 (=6), is small. As shown in the figure, a point on the polishing pad that comes into contact with the fixed point on the wafer returns to the start point of a fixed trajectory every time the platen makes three revolutions and thereafter resonance occurs resulting in motion along the fixed trajectory. This shows that a certain point on the wafer frequently (but less frequently than in Comparative Examples 1 and 2) comes into contact with only limited regions on the polishing pad.

Figure 9:
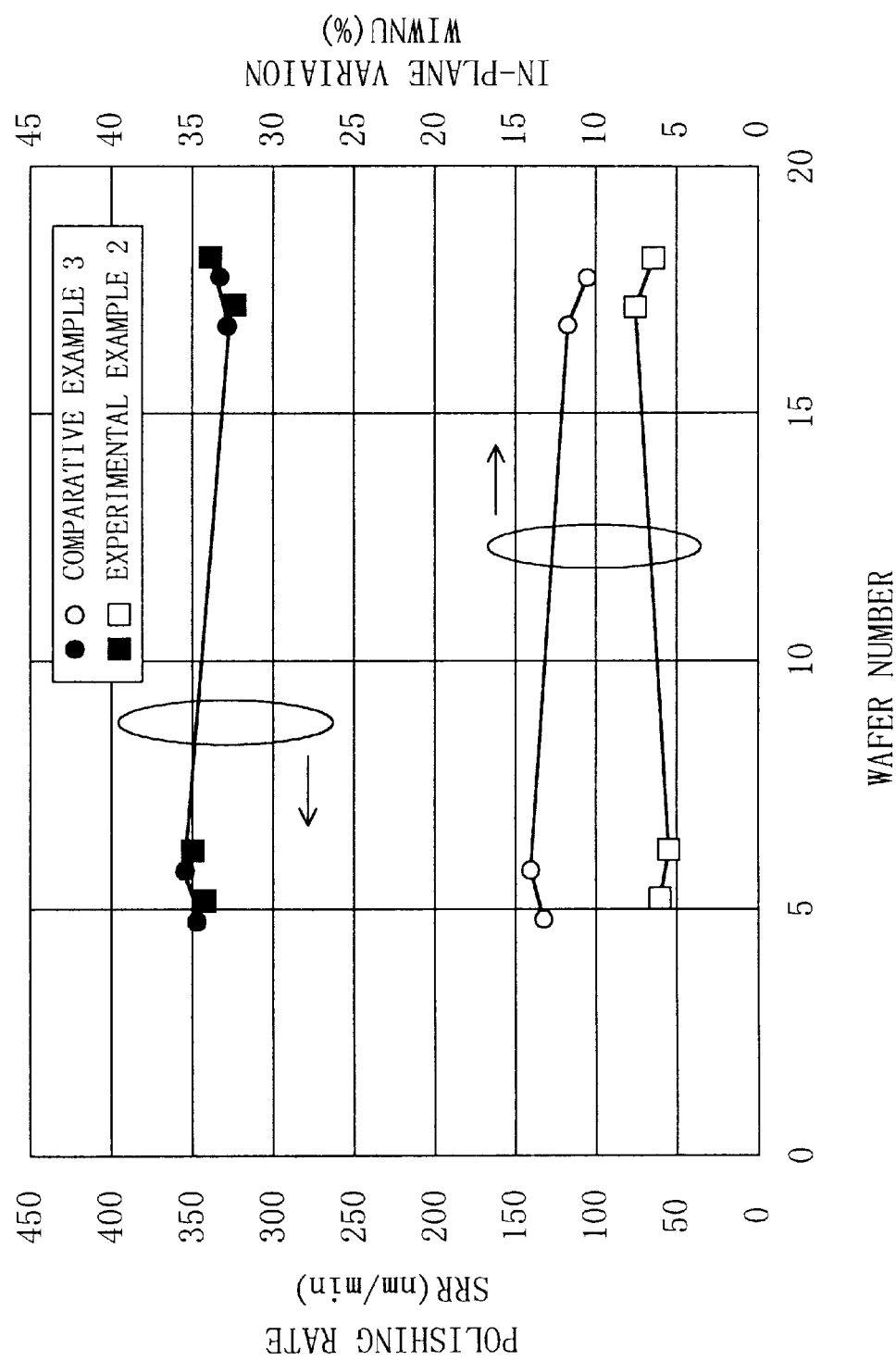
FIG. 9 is a diagram showing both variations in average polishing rate and variations in average polishing rate of different wafers prepared by performing CMP processing under conditions of Experimental Example 2 and under conditions of Comparative Example 3 respectively.
Figure 10:
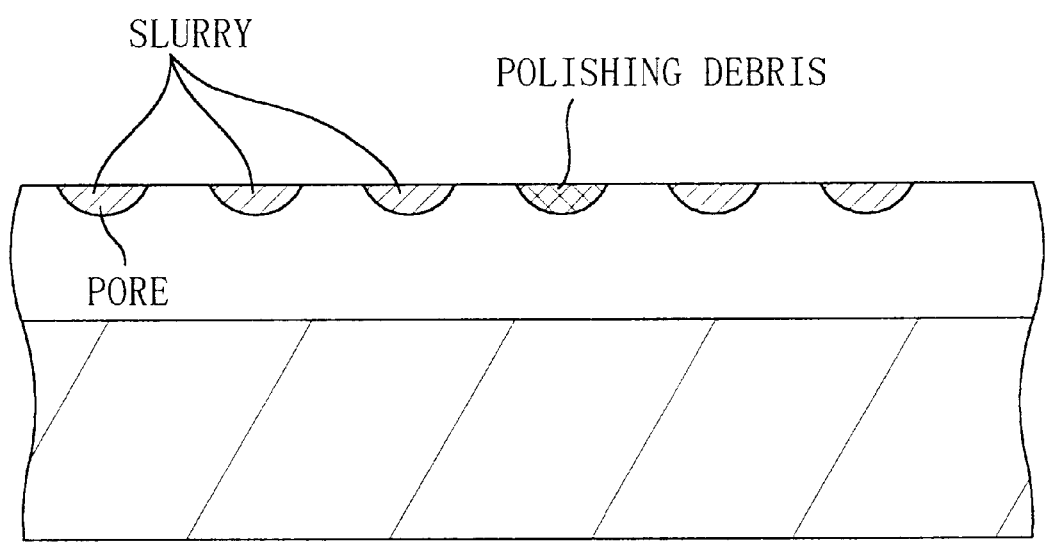
FIG. 10 shows in cross section a surface state of a polishing pad under polishing by CMP.

Next, the difference in uniformity of the wafer planarity between the Experimental Examples polishing conditions utilizing the present invention and the Comparative Examples polishing conditions is described below. FIG. 9 graphically compares Experimental Example 2 (wp=61 rpm; w=43) and Comparative Example 3 (wp=60 rpm; w=40 rpm). In other words, SSR (nm/min) indicated by ■ and WIWNU (Within-Wafer-Non-Uniformity) (%) indicated by □ of Experimental Example 2 are compared with polishing rates indicated by ● and polishing rate variations indicated by ○ of Comparative Example 3, where SSR indicates the average wafer polishing rate and WIWNU indicates the wafer in-plane polishing rate variation. A load of 140 KgG was applied to the carrier, and wafer polishing rate measurement is carried out at several locations, exclusive of regions laying within 5 mm from the periphery of the wafer. A variation in polishing rate is expressed by a value obtained as a result of division of a difference between the maximum and minimum of measured values at locations in the same wafer by an average measured value. FIG. 9 shows that there is no difference in average polishing rate between Comparative Example 3 and Experimental Example 2; however, if CMP processing is performed using Experimental Example's 2 conditions in accordance with the present invention, this achieves further reductions in in-wafer polishing rate variation as compared with Comparative Example 3. Uniformity of the wafer planarity is clearly improved by utilizing the present invention.

It follows from the foregoing experimental and comparative examples that, when the ratio of wp (the platen rotational speed) to w (the wafer rotational speed) is expressed by natural numbers m and n of which one is prime to the other, the L.C.M. of these two numbers is preferably 10 or beyond in order to obtain the present invention's benefits.

In such a case it is much preferred that none of the numbers m and n are 1 (for example, m=5 and n=2), which is however not absolutely necessary. For instance, in case m is assigned a value of 10 and n a value of 1, such a value setting allows the carrier to make one revolution when the platen makes ten revolutions, and, at this point in time, a contact point with a fixed point on the wafer returns to the start point of a fixed trajectory on the polishing pad. In other words, a fixed trajectory formed on the polishing pad comprises a first spiral that gets to an internal-diameter portion from an external-diameter portion when it makes five revolutions and a second spiral which rotates in a direction opposite to that of the first spiral and which gets to an outer peripheral portion from an inter peripheral portion when it makes five revolutions. On the other hand, if m and n are assigned a value of 1 and a value of 10 respectively (m=1 and n=10), this value setting allows the platen to make one revolution when the carrier makes ten revolutions, and, at this point in time, a contact point returns to the start point of a fixed trajectory. The resulting trajectory is in the form of a small coil of ten rounds. In both of the foregoing settings (i.e., the L.C.M. of the numbers m and n is ten or greater), a fixed trajectory is formed on the polishing pad in order that it can pass through many regions, therefore avoiding circumstances in which there is an increase in the probability that a specified point on the wafer frequently comes into contact with regions that are low in polishing rate as compared with other points.

Embodiment 2

The present invention can be applied to a process, i.e., a dressing process step, for dressing of a polishing pad with a diamond dresser to make polishing-pad activation (polishing rate recovery). Grains of diamond, which are very fine, are embedded into a surface of a diamond dresser. These diamond grains have different shapes and dimensions. If each diamond grain draws the same trajectory with considerable frequency at the time of performing a dressing on a polishing pad that is being rotated while rotating a diamond dresser, this becomes a bar to obtaining the uniformity of dressing, as in the case of polishing. As a result, polishing-pad activation is not carried out in uniform fashion, in addition to which local variations in polishing rate occur in the polishing pad. The foregoing first embodiment can be applied intact to dressing uniformity processing.

A second embodiment of the invention is now described. The second embodiment provides a method for dressing of a polishing pad which uses the first embodiment of the present invention.

Figure 11:
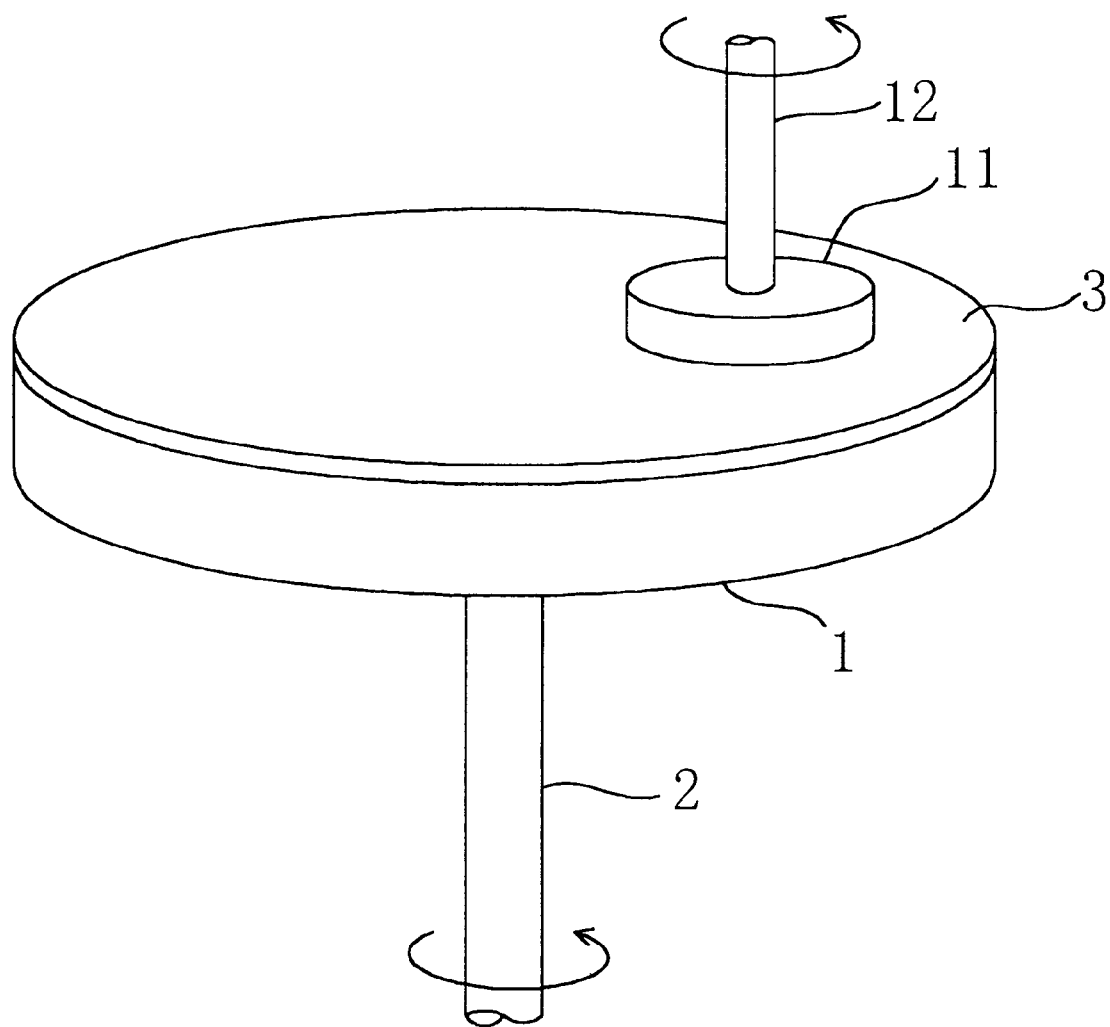
FIG. 11 is a perspective view outlining a polishing pad dressing method of a second embodiment of the invention.

FIG. 11 is a perspective view of a polishing apparatus when a dressing according to the second embodiment is performed on a polishing pad. A CMP polishing apparatus, used in the present embodiment as well as in the first embodiment, is illustrated by reference to FIG. 11. The CMP polishing apparatus, on one hand, includes a disk-like platen 1 rotatable about its central axis, a platen shaft 2 which centrally supports the platen 1, a polishing pad 3 affixed onto the platen 1 and formed of a closed-cell-foam type polyurethane resin and an unwoven cloth. A dresser apparatus, on the other hand, includes a disk-like dresser 11 and a dresser shaft 12 which centrally supports the dresser 11. Both the platen shaft 2 and the dresser shaft 12 are forcefully rotated by servomotor or the like. The rotational speed of the platen shaft 2 and the rotational speed of the dresser shaft 12 are variably controlled independently of each other.

Figure 12:
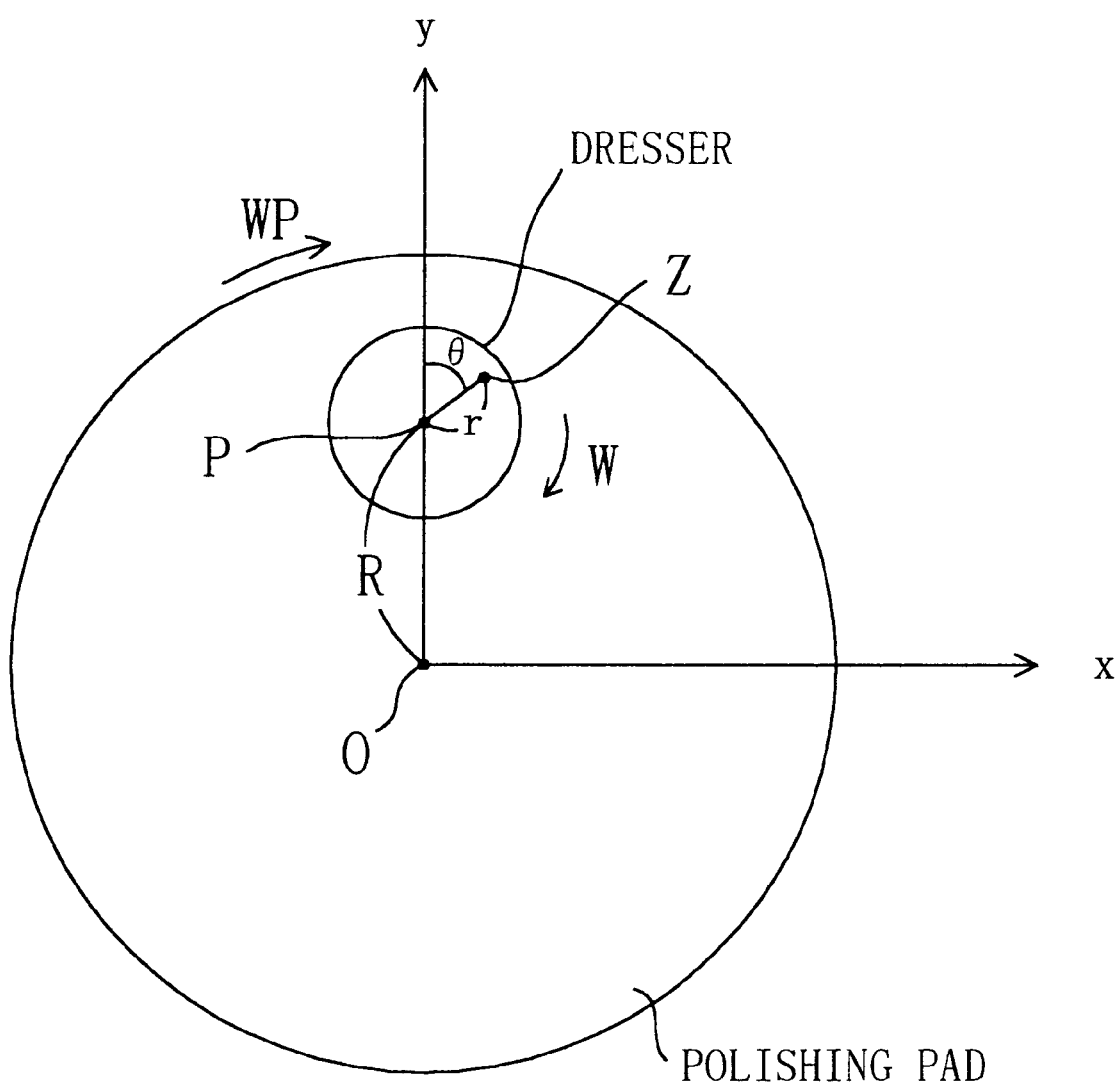
FIG. 12 is a complex plane representaion useful in understanding relative motion between a polishing pad and a dresser in the second embodiment.

FIG. 12 is a complex plane representation useful in understanding the positional relationship between the polishing pad 3 in the polishing apparatus and the dresser 11. As can be seen from FIG. 12, the manner of relative motion between the rotation of the platen 1 and the rotation of the dresser 11 is basically identical with the manner of relative motion between the rotation of the platen 1 and the rotation of the carrier 4 in the first embodiment of the present invention.

Parameters of FIG. 2 concerning both the polishing-pad rotational motion and the dresser rotational motion are as follows. The same signs as the first embodiment are used.

r: distance between dresser center P and point Z on the dresser

R: distance between P and polishing pad center O w: dresser rotational angular speed θ: dresser initial phase angle wp: platen rotational angular speed Equations (1)–(6) of the first embodiment are applicable to the second embodiment without having to make any changes thereto.

Thus, if w/wp=½, a trajectory drawn on the pad by contact between the point Z and the pad completely coincides with another drawn on the pad by contact between the point X and the pad (these two points Z and X are in symmetry with respect to P, in other words they differ from each other in phase by 180°), with only a time lag of w/pi (½ of the period of w).

Figure 13:
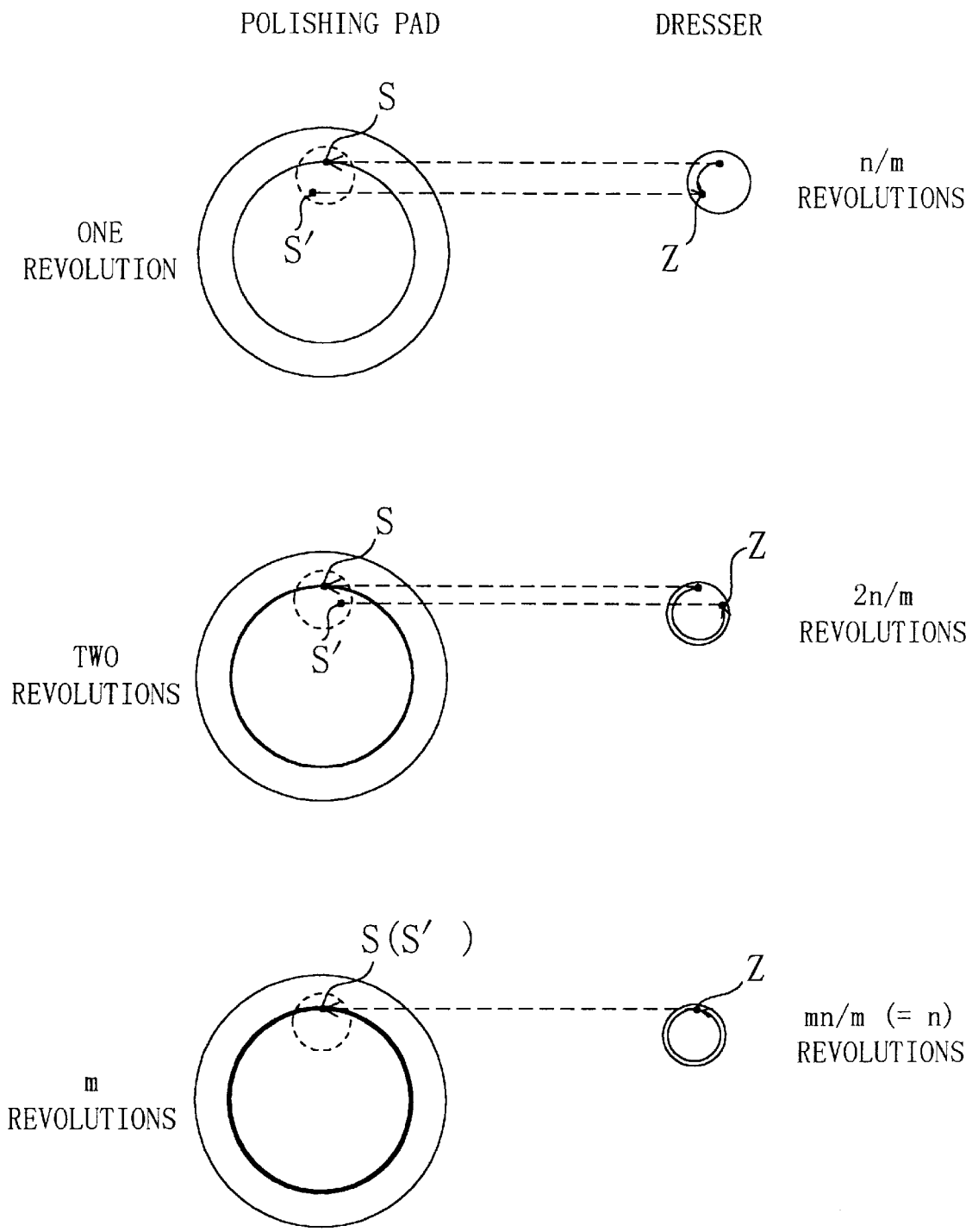
FIG. 13 is a top view showing respective contact positions at which a fixed point on the dresser contacts with the polishing pad when the polishing pad makes revolutions an integral number of times, namely one revolution, two revolutions, and m revolutions in the second embodiment.

Inconveniences occur when the platen-dresser rotational speed ratio is simply expressed by integers and when the ratio is expressed in a simple ratio form such as (integer):1. An exemplary case is now considered in which the ratio of the polishing-pad angular speed and the dresser angular speed is m:n where the number m is prime to the number n and the numbers m and n are positive integers, exclusive of 1. FIG. 13 is a diagram showing rotational states of the polishing pad and rotational states of the dresser when the polishing pad makes one revolution, when the polishing pad makes two revolutions, and when the polishing pad makes m revolutions respectively. Let us assume here that Point Z on the dresser is in contact with Point S on the polishing pad in the initial state (see FIG. 13). Point S is a start point at which a fixed trajectory starts. When the platen makes one revolution from the initial state, the dresser makes n/m revolutions. Since the number m is prime to the number n, division of n by m, i.e., n/m, never yields an integral quotient, and Point S' on the polishing pad that comes into contact with Point Z on the dresser will never conform to Point S. When the platen makes m revolutions, the dresser makes mn/m (=n) revolutions, and Point S' on the polishing pad that comes into contact with Point Z on the dresser now conforms to Point S (i.e., the original contact point) for the first time, in other words a point on the polishing pad that comes into contact with Point Z on the dresser arrives at Start Point S (the fixed trajectory start point). The polishing pad and the wafer thereafter repeat the same relative motion, as a result of which Point Z on the on the dresser moves along the fixed trajectory on the polishing pad.

When the least common multiple (L.C.M.) of the integers m and n (the number m is prime to the number n), i.e., mn, is large, the length of the fixed trajectory extends. In addition to contact with a specific point on the polishing pad, Point Z on the dresser is evenly brought into contact also with many other points on the polishing pad. On the other hand, when the L.C.M. is small, Point Z soon returns to Start Point S and thereafter moves along the same trajectory, in other words Point Z comes into contact with limited regions. This produces the possibility that a specific point on the dresser is brought, with considerable frequency, into contact with a low polishing-rate region that is locally created in the polishing pad while other points on the dresser infrequently come into contact with the region in question.

By making a change in platen-dresser angular speed ratio in the present embodiment, trajectories similar to FIGS. 4–8 are drawn or formed on polishing pads respectively, as in the first embodiment.

The following conclusions are drawn from the above consideration.

1. When the platen-dresser rotational speed ratio is expressed by two natural numbers, i.e., n and m (the number n is prime to the number m), it is preferred to make the L.C.M. of these numbers m and n, i.e., mn, as large as possible, preferably 10 or beyond.

2. It is particularly preferred that the platen-dresser rotational speed ratio, i.e., the platen-dresser angular speed ratio, nearly corresponds to, or is approximated to an irrational number that cannot be expressed in the form of a natural (rational) number m/n.

3. It is sufficient that the platen-dresser rotational speed ratio is set in such a way as to prevent entrance of a point on the polishing pad to a fixed trajectory during polishing. In other words, the ratio is set in order for a point on the polishing pad that comes into contact with Point Z on the dresser not to conform to Start Point S with the polishing pad and the dresser rotated an integral number of times.

4. It is preferred that, although the surface region of the polishing pad is divided into sub-regions by a trajectory drawn by a point on the polishing pad that comes into contact with Point Z on the dresser (see FIG. 5), these sub-regions are uniform in size and fine within a concentric ring-like region, i.e., within a ring-like region having identical radii from the polishing pad center $\bigcirc$. In other words, it is preferred that the foregoing trajectory is evenly distributed on the polishing pad, to densely form lattice-like patterns thereon.

Dressing is not a process step belonging in the manufacture of semiconductor devices (a step for dresser surface planarization), and it is therefore required that polishing rate activation be completed as quickly as possible. The present invention is available to realizing polishing pad surface activation in a short time.

Other Embodiments

In the foregoing embodiments of the invention, it is arranged such that the direction of rotation of the platen and the direction of rotation of the carrier (dresser) are the same. It is to be noted that the invention is not limited to such embodiments. For instance, even when they rotate in opposite directions, the same effects that the first and second embodiments achieve can be obtained by, for example, arrangement that the platen-carrier (dresser) rotational speed ratio is expressed by two natural numbers of which one is prime to the other and the L.C.M. of these numbers is 10 or greater.

In a variation to the foregoing, a polishing pad (formed of closed-cell-foam type polyurethane or the like material) is employed, having a series of about 1-mm grooves or pores formed, at a pitch in the range of from about 5 mm to about 10 mm, on a surface thereof. These grooves (pores) are provided for smooth supply and discharge of a slurry-like abrasive liquid. Although, when local groove (pore) blocking occurs to cause a certain groove to become blocked, such a clogged groove can be taken as an inactive region that does not contribute to the action of polishing, even in such a case it is possible to improve uniformity of the in-wafer planarity by utilizing the present invention.

What is claimed is:

1. A wafer polishing method comprising the steps of:
   (a) rotating a polishing pad affixed to a platen at a first rotational speed, said polishing pad having a plane surface;
   (b) supplying an abrasive material over said surface of said polishing pad; and
   (c) pressing a wafer to be polished against said polishing pad surface while at the same time rotating said wafer at a second rotational speed, said wafer having a plane surface;
   wherein the ratio of said first rotational speed to said second rotational speed is controlled such that a trajectory, formed by points on said polishing pad surface that come into contact with a fixed point on said wafer surface, is distributed uniformly on said polishing pad.

2. The wafer polishing method of claim 1 wherein said rotational speed ratio is controlled such that said points on said polishing pad surface do not form a substantially fixed trajectory during polishing.

3. The wafer polishing method of claim 1 wherein said rotational speed ratio is controlled such that, when said ratio is expressed using two natural numbers m and n of which one is prime to the other, the least common multiple of said numbers m and n is ten or beyond.

4. The wafer polishing method of claim 1 wherein said rotational speed ratio is controlled to be an approximate irrational number.

5. The wafer polishing method of claim 1 wherein said polishing pad is formed of a closed-cell-foam type polyurethane resin.

6. The wafer polishing method of claim 1 wherein said polishing pad is provided with periodically-formed grooves or pores which are formed on said polishing pad surface.

* * * * *